(12) United States Patent
Khachatryan et al.

(10) Patent No.: US 10,673,015 B2
(45) Date of Patent: Jun. 2, 2020

(54) ORGANIC LUMINESCENCE DISPLAY DEVICE AND METHOD OF MANUFACTURING THE SAME

(71) Applicant: Samsung Display Co., Ltd., Yongin-si, Gyeonggi-do (KR)

(72) Inventors: Hayk Khachatryan, Yongin-si (KR); Kihyun Kim, Yongin-si (KR); Sunho Kim, Yongin-si (KR); Jeongho Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 102 days.

(21) Appl. No.: 15/868,678

(22) Filed: Jan. 11, 2018

(65) Prior Publication Data
US 2018/0130976 A1 May 10, 2018

Related U.S. Application Data

(62) Division of application No. 15/009,421, filed on Jan. 28, 2016, now Pat. No. 9,893,313.

(30) Foreign Application Priority Data

Jun. 19, 2015 (KR) .......................... 10-2015-0087585

(51) Int. Cl.
*H01L 51/56* (2006.01)
*H01L 51/52* (2006.01)
(52) U.S. Cl.
CPC .......... *H01L 51/5253* (2013.01); *H01L 51/56* (2013.01); *H01L 2227/326* (2013.01)

(58) Field of Classification Search
CPC ........................... H01L 51/5253; H01L 51/56
See application file for complete search history.

(56) References Cited

U.S. PATENT DOCUMENTS

| | | | | |
|---|---|---|---|---|
| 4,757,364 A | * | 7/1988 | Miura | H01L 29/94 257/289 |
| 5,232,860 A | | 8/1993 | Kawanishi et al. | |
| 5,262,347 A | | 11/1993 | Sand | |
| 5,378,534 A | * | 1/1995 | Kuroanagi | G01D 15/02 427/146 |

(Continued)

FOREIGN PATENT DOCUMENTS

| JP | 2506081 B2 * | 6/1996 | ............. G03F 7/167 |
|---|---|---|---|
| KR | 10-2009-0038326 A | 4/2009 | |

(Continued)

OTHER PUBLICATIONS

U.S. National Library of Medicine, "Stearic Acid" (2004): pp. 1-3 (retrieved from https://pubchem.ncbi.nlm.nih.gov/compound/Stearic-acid) (Year: 2004).*

(Continued)

*Primary Examiner* — Michele Fan
(74) *Attorney, Agent, or Firm* — F. Chau & Associates, LLC

(57) ABSTRACT

An organic luminescence display device includes a substrate, a display unit on the substrate, a thin-film encapsulation layer sealing the display unit, and a stress-reducing layer on the thin-film encapsulation layer, wherein the stress-reducing layer includes an organic molecular film.

7 Claims, 20 Drawing Sheets

(56) References Cited

U.S. PATENT DOCUMENTS

| | | | |
|---|---|---|---|
| 5,665,802 A | 9/1997 | Maki et al. | |
| 6,071,795 A | 6/2000 | Cheung et al. | |
| 8,216,876 B2 | 7/2012 | Yasumatsu | |
| 9,614,176 B2* | 4/2017 | Zeng | H01L 51/52 |
| 2002/0032982 A1* | 3/2002 | Berger | C11C 5/002 |
| | | | 44/519 |
| 2008/0058517 A1* | 3/2008 | Bradley | C07F 15/0033 |
| | | | 544/225 |
| 2008/0113460 A1 | 5/2008 | Shelton et al. | |
| 2009/0195152 A1* | 8/2009 | Sawano | B82Y 20/00 |
| | | | 313/504 |
| 2010/0026166 A1* | 2/2010 | Takahashi | H01L 51/5256 |
| | | | 313/504 |
| 2010/0237337 A1* | 9/2010 | Kamura | H01L 51/052 |
| | | | 257/40 |
| 2011/0169017 A1* | 7/2011 | Stainer | H01L 27/3248 |
| | | | 257/88 |
| 2012/0034451 A1 | 2/2012 | Seo et al. | |
| 2012/0251182 A1* | 10/2012 | Adachi | B82Y 20/00 |
| | | | 399/177 |
| 2014/0160419 A1 | 6/2014 | Lee et al. | |
| 2014/0319999 A1* | 10/2014 | Cho | B32B 3/04 |
| | | | 313/504 |
| 2014/0332786 A1* | 11/2014 | Nakazawa | G02B 5/3025 |
| | | | 257/40 |
| 2015/0072124 A1* | 3/2015 | Sakaguchi | G02B 1/105 |
| | | | 428/216 |
| 2015/0171369 A1* | 6/2015 | Xie | H01L 51/5256 |
| | | | 257/40 |
| 2016/0104861 A1* | 4/2016 | Zeng | H01L 51/56 |
| | | | 257/40 |

FOREIGN PATENT DOCUMENTS

| | | |
|---|---|---|
| KR | 10-2012-0012891 A | 2/2012 |
| KR | 10-2012-0130966 A | 12/2012 |
| KR | 10-2013-0138877 A | 12/2013 |
| KR | 10-2014-0046292 A | 4/2014 |
| KR | 10-2015-0002959 A | 1/2015 |
| KR | 20150002959 A * | 1/2015 |

OTHER PUBLICATIONS

"*Flexible Flat Panel Displays*," Edited by G.P. Crawford, © 2005 John Wiley & Sons, Ltd, 55 pages.

Choi et al., "Polymers for flexible displays: From material selection to device applications," *Prog. Polym. Sci.* 33 (2008) pp. 581-630.

DiBenedetto et al., "Molecular Self-Assembled Monolayers and Multilayers for Organic and Unconventional Inorganic Thin-Film Transistor Applications," *Adv. Mater.* 2009, 21, pp. 1407-1433.

French et al., "Flexible Displays and Electronics Made in AM-LCB Facilities by the EPLaR™ Process," 58.4: Invited Paper, *SID 07 Digest*, 2007, pp. 1680-1683.

Geffroy et al., "Review: Organic light-emitting diode (OLED) technology: materials, devices and display technologies," *Polym Int* 55 (2006) pp. 572-582.

Haq et al., "Temporary bond-debond technology for high-performance transistors on flexible substrates," *Journal of the SID* 18/11 (2010) pp. 884-891.

Inoue et al., "Surface-Free Technology by Laser Annealing (SUFTLA) and Its Application to Poly-Si TFT-LCDs on Plastic Film With Integrated Drivers," *IEEE Transactions on Electron Devices*, vol. 49, No. 8, Aug. 2002, pp. 1353-1360.

Lewis, Jay, "Material challenge for flexible organic devices," *materialstoday*, Apr. 2006, vol. 9, No. 4, pp. 38-45.

Love et al., "Self-Assembled Monolayers of Thiolates on Metals as a Form of Nanotechnology," *Chem. Rev.* 2005, 105, pp. 1103-1169.

* cited by examiner

400b

Hexadecanoic acid

9-Anthracenecarboxylic acid

Dodecanoic acid, 12-phosphono-,
1-[11-(2-anthracenyl)undecyl] ester

Phosphonic acid,
P-9-anthracenyl

1-Octadecanephosphonic acid

ORGANIC LUMINESCENCE DISPLAY DEVICE AND METHOD OF MANUFACTURING THE SAME

RELATED APPLICATION

Any and all applications for which a foreign or domestic priority claim is identified in the Application Data Sheet as filed with the present application are hereby incorporated by reference under 37 CFR 1.57. For example, this application is a divisional of U.S. patent application Ser. No. 15/009,421, filed Jan. 28, 2016 which claims the benefit of Korean Patent Application No. 10-2015-0087585, filed on Jun. 19, 2015, in the Korean Intellectual Property Office, the disclosure of which is incorporated herein in its entirety by reference.

BACKGROUND

Field

The disclosure relates to an organic luminescence display device and a method of manufacturing the same.

Description of the Related Technology

An organic luminescence display device includes a hole injection electrode, an electron injection electrode, and an organic light-emitting device including an organic emission layer between the hole injection electrode and the electron injection electrode, and is a self-emission display device that emits light in such a way that in the organic emission layer, holes provided by the hole injection electrode recombine with electrons provided by the electron injection electrode to generate excitons, which change from an exited state to a ground state, generating light.

Organic luminescence display devices, which are self-emission display devices, do not require a separate light source. Hence, they can be driven at a low voltage, are lightweight and thin, and have wide viewing angles, high contrast, and short response speeds. Due to these high-quality characteristics, organic luminescence display devices are gaining more importance as future-generation display devices.

SUMMARY

One or more exemplary embodiments include an organic luminescence display device and a method of manufacturing the same.

Additional aspects will be set forth in part in the description which follows and, in part, will be apparent from the description, or may be learned by practice of the presented exemplary embodiments.

According to some embodiments, an organic luminescence display device includes: a substrate; a display unit on the substrate; a thin-film encapsulation layer sealing the display unit; and a stress-reducing layer on the thin-film encapsulation layer, wherein the stress-reducing layer includes an organic molecular film.

In some embodiments, the stress-reducing layer may have a thickness of about 1 nm to about 3 nm.

In some embodiments, the stress-reducing layer may include a self-assembled monolayer.

In some embodiments, the self-assembled monolayer may include an alkyl chain being a body part thereof, a reactive group linked to the alkyl chain and attached on the thin-film encapsulation layer, and a functional group linked to the alkyl chain, the reactive group is selected from silane, a carboxylic acid, and a phosphonic acid, and the functional group is selected from $NH_2$, OH, COOH, and an alkyl group.

In some embodiments, the stress-reducing layer may include a fatty acid.

In some embodiments, the fatty acid may be a stearic acid having a carbon chain.

According to one or more exemplary embodiments, a method of manufacturing an organic luminescence display device includes: preparing a carrier substrate; forming a display unit on the carrier substrate; forming a thin-film encapsulation layer sealing the display unit; forming a stress-reducing layer on the thin-film encapsulation layer; and forming a top protection film on the stress-reducing layer, wherein the stress-reducing layer includes an organic molecular film.

In some embodiments, the stress-reducing layer may have a thickness of about 1 nm to about 3 nm.

In some embodiments, the stress-reducing layer may include a self-assembled monolayer.

In some embodiments, the stress-reducing layer may include a fatty acid.

In some embodiments, the fatty acid may include a stearic acid having a carbon chain.

In some embodiments, the method may further include, after preparing the carrier substrate, forming a sacrificial layer on the carrier substrate.

In some embodiments, the sacrificial layer may include an inorganic material and has a thickness of about 500 nm to about 2000 nm.

In some embodiments, the sacrificial layer may include molybdenum oxide.

In some embodiments, the method may further include, after the forming the top protection film, removing the carrier substrate by irradiating with a laser, the sacrificial layer to separate the carrier substrate from the display unit.

In some embodiments, the stress-reducing layer may include a self-assembled monolayer, and when irradiated with a laser, the stress-reducing layer expands, and after the carrier substrate is removed, the stress-reducing layer shrinks.

In some embodiments, the stress-reducing layer may include a fatty acid, and when irradiated with a laser and after the carrier substrate is removed, the stress-reducing layer changes in phase.

In some embodiments, when irradiated with a laser, the stress-reducing layer may be liquefied, and after the carrier substrate is removed, the stress-reducing layer may be re-solidified.

In some embodiments, the method may further include, after the carrier substrate is removed, attaching a substrate on the display unit; and removing the top protection film.

BRIEF DESCRIPTION OF THE DRAWINGS

These and/or other aspects will become apparent and more readily understood from the following description of the exemplary embodiments, taken in conjunction with the accompanying drawings in which.

DETAILED DESCRIPTION

Figure 1:
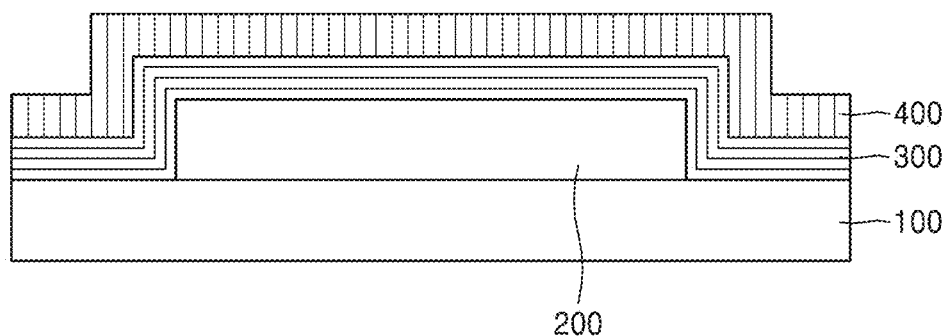
FIG. 1 is a schematic cross-sectional view of an organic luminescence display device according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present disclosure will become apparent by reference to the embodiment that will be described later in detail, together with the accompanying drawings. This disclosure may, however, be embodied in many different forms and should not be limited to the exemplary embodiments.

Hereinafter, embodiments are described in detail by referring to the attached drawings, and in the drawings, like reference numerals denote like elements, and a redundant explanation thereof will not be provided herein.

As used herein, the terms as "first", "second", etc., are used only to distinguish one component from another, and such components should not be limited by these terms.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment is implementable in a different manner, a particular process sequence may be different from that already described. For example, although two processes are explained in a sequential manner, the processes may be performed substantially simultaneously or the process sequence may be the opposite to that explained already.

Figure 2:
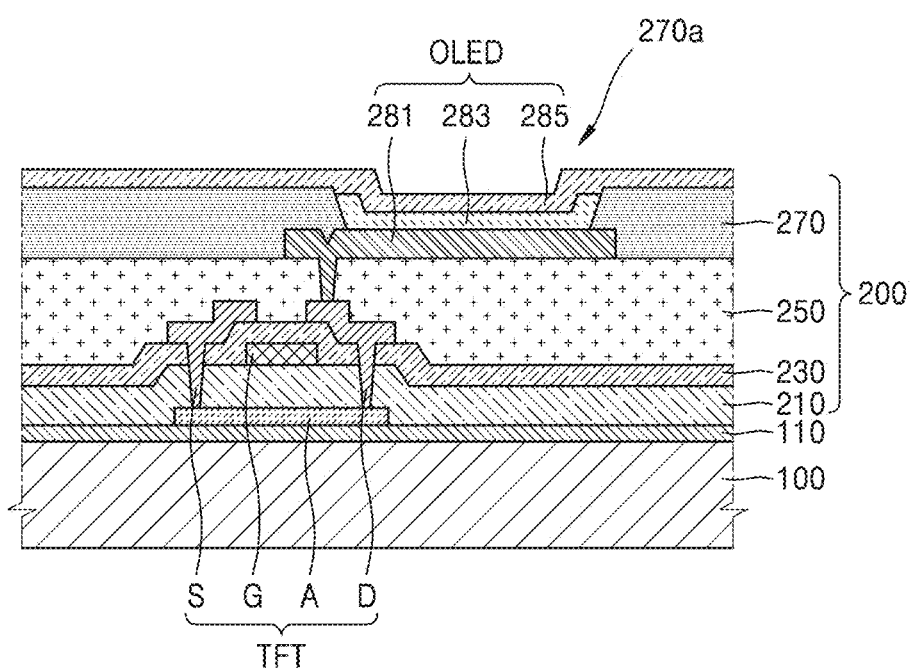
FIG. 2 is a schematic enlarged view of a display unit illustrated in FIG. 1.

FIG. 1 is a schematic cross-sectional view of an organic luminescence display device 1000 according to an exemplary embodiment. FIG. 2 is a schematic enlarged view of a display unit illustrated in FIG. 1.

The organic luminescence display device 1000 of FIG. 1 according to the present embodiment may include a substrate 100, a display unit 200, a thin-film encapsulation layer 300, and a stress-reducing layer 400.

The substrate 100 may include various materials. For example, the substrate 100 may include a glass material or other insulating materials, or a metal thin film.

In one embodiment, the substrate 100 may include at least one selected from a silicone-based polymer, polyurethane, polyurethane acrylate, an acrylate polymer, and an acrylate terpolymer. Examples of the silicone-based polymer are polydimethylsiloxane (PDMS) and hexamethyldisiloxane (HMDSO).

The display unit 200 is formed on the substrate 100. The display unit 200 may generate visible rays that a user may recognize. The display unit 200 may include various devices, for example, an organic light-emitting device or a liquid crystal display device.

As illustrated in FIG. 2, in the present embodiment, the display unit 200 includes an organic light-emitting device OLED.

The organic light-emitting device OLED may include a first electrode 281, an intermediate layer 283 including an organic emission layer, and a second electrode 285.

Each of the first electrode 281 and the second electrode 285 may include various conductive materials.

In a selective embodiment, the first electrode 281 and/or the second electrode 285 may include a light-transmissible material or a light-reflectible material.

The light-transmissible material may include ITO, IZO, ZnO, or $In_2O_3$, and the light-reflectible material may include Ag, Mg, Al, Pt, Pd, Au, Ni, Nd, Jr, Cr, or a compound of these.

The intermediate layer 283 is formed between the first electrode 281 and the second electrode 285, and may include an organic emission layer.

In one embodiment, the intermediate layer 283 may include an organic emission layer, and may further include at least one of a hole injection layer (HIL), a hole transport layer, an electron transport layer, and an electron injection layer. However, the present embodiment is not limited thereto. In some embodiments, the intermediate layer 283 may include an organic emission layer and may further include other various functional layers.

As illustrated in FIG. 1, in the present embodiment, the thin-film encapsulation layer 300 may be used to completely seal the display unit 200, thereby protecting the display unit 200 from external moisture or oxygen.

In one embodiment, the thin-film encapsulation layer 300 may be formed on the display unit 200, and ends of the thin-film encapsulation layer 300 may be attached on the substrate 100.

In detail, as illustrated in FIG. 1, after the display unit 200 is formed on the substrate 100, a central portion of the thin-film encapsulation layer 300 covers the display unit 200, and ends of the thin-film encapsulation layer 300 are attached on the substrate 100.

The stress-reducing layer 400 may be formed on the thin-film encapsulation layer 300, and may include an organic molecular film.

In one embodiment, the stress-reducing layer 400 may include an organic molecular film having liquidity.

The stress-reducing layer 400 may protect a top portion of the thin-film encapsulation layer 300 from cracking in the manufacturing course of the organic luminescence display device 1000, and ultimately, damage to the organic light-emitting device OLED, caused by further cracking of the thin-film encapsulation layer 300 and the display unit 200, may be prevented.

In one embodiment, the stress-reducing layer 400 may include a self-assembled monolayer (SAM). The SAM has excellent liquidity. Accordingly, even when stress occurs, the stress-reducing layer 400 may absorb the stress by changing its shape.

In another selective embodiment, the stress-reducing layer 400 may include a fatty acid. The fatty acid may also have excellent liquidity due to its chain molecular structure, and accordingly, once stress occurs, the fatty acid may absorb the stress.

In one embodiment, the stress-reducing layer 400 may include a stearic acid, which is an example of a saturated fatty acid.

In one embodiment, a thickness of the stress-reducing layer 400 may be in a range of about 1 nm to 3 nm. However, the thickness of the stress-reducing layer 400 is not limited thereto, and may vary as long as the stress-reducing layer 400 does not allow the top portion of the thin-film encapsulation layer 300 to crack and absorbs stress.

Referring to FIG. 2, the display unit 200 includes a thin film transistor TFT and the organic light-emitting device OLED. Hereinafter, the display unit 200 will be described in detail.

A buffer layer 110 may be formed on the substrate 100. The buffer layer 110 may act as a barrier layer to block diffusion of impurity ions and permeation of moisture or external gas, and to planarize a surface of the substrate 100, and/or a blocking layer.

The thin film transistor TFT may be formed on the buffer layer 110. The thin film transistor TFT may include an active layer A which may include polysilicon. The active layer A may include a channel region without impurities doped thereon, and a source region and a drain region, each with impurities doped thereon, wherein the source region and the drain region are respectively located on sides of the channel region. Herein, impurities may vary according to a thin film transistor, and may be an N-type impurity or a P-type impurity.

Once the active layer A is formed, a gate insulating film 210 may be formed on the active layer A, covering the entire surface of the substrate 100. The gate insulating film 210 may be a single or multi-layer, which includes an inorganic material, such as silicon oxide or silicon nitride. The gate insulating film 210 insulates the active layer A from a gate electrode G located thereabove.

Once the gate insulating film 210 is formed, the gate electrode G may be formed on the gate insulating film 210. The gate electrode G may be formed by photolithography and etching.

A material for forming the gate electrode G may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), nickel (Li), calcium (Ca), titanium (Ti), tungsten (W), and copper (Cu).

Once the gate electrode G is formed, a first interlayer insulating film 230 may be formed thereon, covering the entire surface of the substrate 100.

The first interlayer insulating film 230 may include an inorganic material. For example, the first interlayer insulating film 230 may include metal oxide or metal nitride. Examples of the inorganic material are silicon oxide ($SiO_2$), silicon nitride, nitride siliconic acid (SiON), aluminum oxide ($Al_2O_3$), titanium oxide ($TiO_2$), tantalum oxide ($Ta_2O_5$), hafnium oxide ($HfO_2$), and zinc oxide ($ZrO_2$).

The first interlayer insulating film 230 may be a single- or multi-layer including an inorganic material, such as silicon oxide and/or silicon nitride. In some embodiments, the first interlayer insulating film 230 may have a two-layer structure of silicon oxide/silicon nitride or silicon nitride/silicon oxide.

A source electrode S and a drain electrode D, constituting a thin film transistor, may be disposed on the first interlayer insulating film 230.

Each of the source electrode S and the drain electrode D may include at least one metal selected from aluminum (Al), platinum (Pt), palladium (Pd), silver (Ag), magnesium (Mg), gold (Au), nickel (Ni), neodymium (Nd), iridium (Jr), chromium (Cr), nickel (Li), calcium (Ca), molybdenum (Mo), titanium (Ti), tungsten (W), and copper (Cu).

A via-layer 250 may be formed on the entire surface of the substrate 100, covering the source electrode S and the drain electrode D. The first electrode 281 may be formed on the via-layer 250. According to the embodiment illustrated in FIG. 1, the first electrode 281 is connected to the drain electrode D through a via-hole.

The via-layer 250 may include an insulating material. For example, the via-layer 250 may be a single layer or a multi-layer formed by using various deposition methods using an inorganic material, an organic material, or an organic/inorganic composite. In some embodiments, a planarization film PL may include at least one material selected from a polyacrylate resin, an epoxy resin, a phenolic resin, a polyamides resin, a polyimide resin, an unsaturated polyester resin, a poly phenylene resin, a poly phenylenesulfide resin, and a benzocyclobutene (BCB).

The organic light-emitting device OLED may be disposed on the via-layer 250. The organic light-emitting device OLED may include the first electrode 281, the intermediate layer 283 including an organic emission layer, and the second electrode 285. The organic luminescence display device 1000 may further include a pixel-defining layer 270.

At least one of the first electrode 281 and the second electrode 285 may include a transparent electrode or a reflective electrode. When the first electrode 281 or the second electrode 285 includes a transparent electrode, the transparent electrode may include ITO, IZO, ZnO, or $In_2O_3$, and when the first electrode 281 or the second electrode 285 includes a reflective electrode, the reflective electrode may include a reflection film formed by using Ag, Mg, Al, Pt, Pd, Au, Ni, Nd, Jr, Cr, or a compound of these, and a transparent film formed by using ITO, IZO, ZnO or $In_2O_3$. In some embodiments, the first electrode 281 or the second electrode 285 may have the structure of ITO/Ag/ITO.

The pixel-defining layer 270 may define a pixel region and a non-pixel region. The pixel-defining layer 270 has an opening partially exposing the first electrode 281, and may cover the entire surface of the substrate 100. The intermediate layer 283 may be formed inside the opening 270a, and accordingly, the opening 270a may substantially act as a pixel region.

Figure 3:
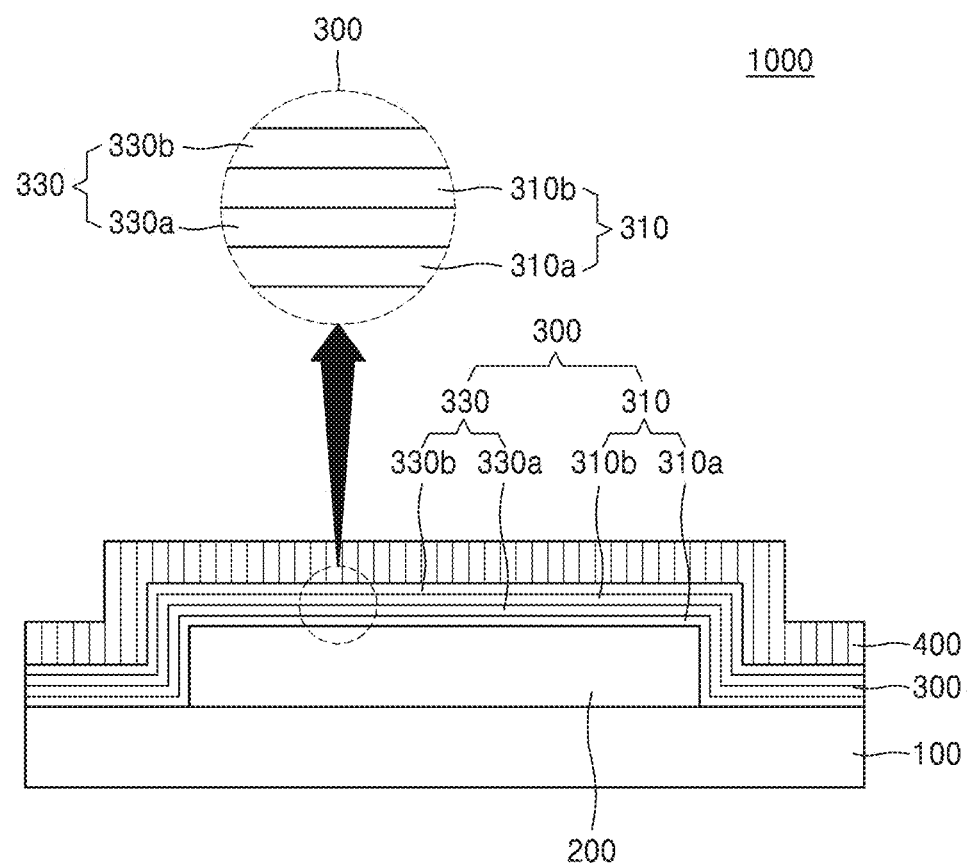
FIG. 3 is a cross-sectional view of an organic luminescence display device according to an exemplary embodiment, including an enlarged view of a thin-film encapsulation layer constituting the organic luminescence display device.

FIG. 3 is a cross-sectional view of the organic luminescence display device 1000 according to an exemplary embodiment, including an enlarged view of the thin-film encapsulation layer 300 constituting the organic luminescence display device 1000.

In one embodiment, the thin-film encapsulation layer 300 has a stack structure of a plurality of thin-film layers, including an inorganic film 310 and an organic film 330, which are alternately stacked.

In one embodiment, as illustrated in FIG. 3, the thin-film encapsulation layer 300 may include a first inorganic film 310a, a first organic film 330a, a second inorganic film 310b, and a second organic film 330b, which are sequentially stacked in this stated order. However, the number of these films is not limited thereto, and the thin-film encapsulation layer 300 may be formed by alternately stacking a plurality of layers.

The inorganic film 310 may thoroughly prevent permeation of oxygen or moisture, and the organic film 330 may absorb stress applied to the inorganic film 310 to provide flexibility.

The inorganic film 310 may be a single film or a stack film including metal oxide or metal nitride. In one embodiment, the inorganic film 310 may include at least one selected from silicon nitride, $Al_2O_3$, $SiO_2$, and $TiO_2$.

The organic film 330 may include a polymer, for example, a single film or a stack film formed by using at least one selected from polyethylene terephthalate, polyimide, polycarbonate, epoxy, polyethylene, and polyacrylate. For example, the organic film 330 may include polyacrylate. In detail, the organic film 330 may include a polymerization product of a monomer composition including a diacrylate monomer and a triacrylate monomer. The monomer composition may further include a monoacrylate monomer. In some embodiments, the monomer composition may include a photoinitiator, such as TPO, but embodiments are not limited thereto.

Figure 4A:
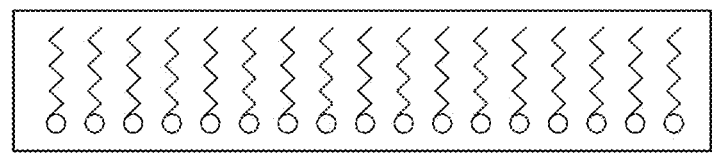
FIG. 4A is a cross-sectional view of a stress-reducing layer including a self-assembled monolayer (SAM), constituting an organic luminescence display device according to an exemplary embodiment.
Figure 4B:
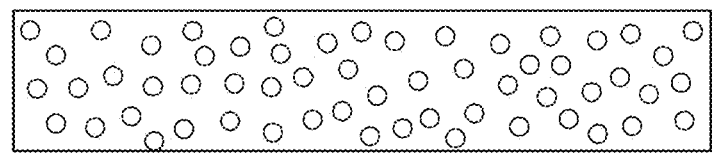
FIG. 4B is a cross-sectional view of a stress-reducing layer including fatty acid, constituting an organic luminescence display device according to an exemplary embodiment.

FIGS. 4A and 4B are respectively schematic views of stress-reducing layers 400a and 400b constituting an organic luminescence display device according to the disclosure. FIG. 4A illustrates an embodiment of a stress-reducing layer which includes an SAM, and FIG. 4B illustrates an embodiment of a stress-reducing layer which includes a fatty acid.

FIGS. 5A-5D illustrates molecular structures of embodiments of the SAM. FIG. 5E illustrates a molecular structure of a stearic acid, an example of the fatty acid.

As illustrated in FIG. 4A, the stress-reducing layer 400a of an organic luminescence display device according to an exemplary embodiment may include the SAM.

The SAM indicates an organic molecular film that is coated on a surface of a substrate, and may include a long-chain alkyl group enabling formation of a regular molecular film and being a body part, a reactive group binding to the long-chain alkyl group, and a functional group.

The reactive group forms the head-group of the organic molecular film to bind to a substrate, and the functional group is a tail part of the organic molecular film and determines the function of a molecular film.

The SAM is coated and aligned on a substrate to form a film, and does not require any devices for its formation, and direct chemical bonds are present between the surface of the substrate and molecules constituting the substrate, thereby providing a strong molecular film even having fluidity.

In an organic luminescence display device according to the present embodiment, the reactive group of the SAM may bind to the uppermost layer of a thin-film encapsulation layer In some embodiments, the stress-reducing layer 400a may include any one of embodiments of the SAM illustrated in FIGS. 5A-5D.

Figure 5A:
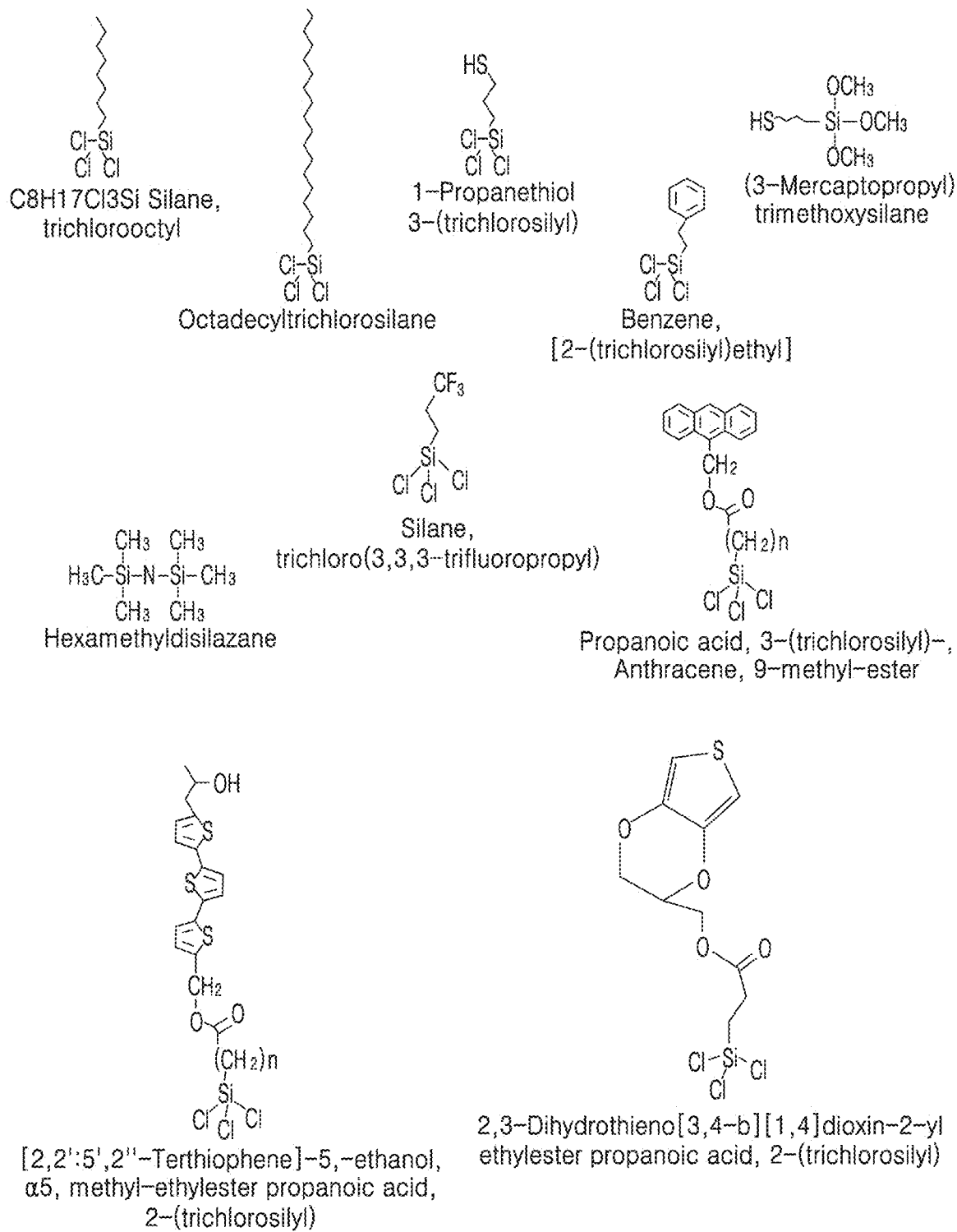
FIGS. 5A-5D illustrates molecular structures of embodiments of the SAM.
Figure 5B:
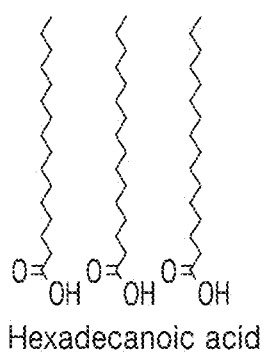
Figure 5B:
Figure 5C:
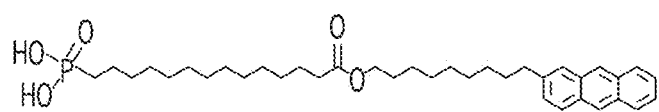
Figure 5C:
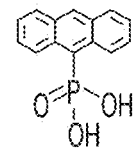
Figure 5C:
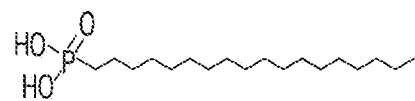
Figure 5D:
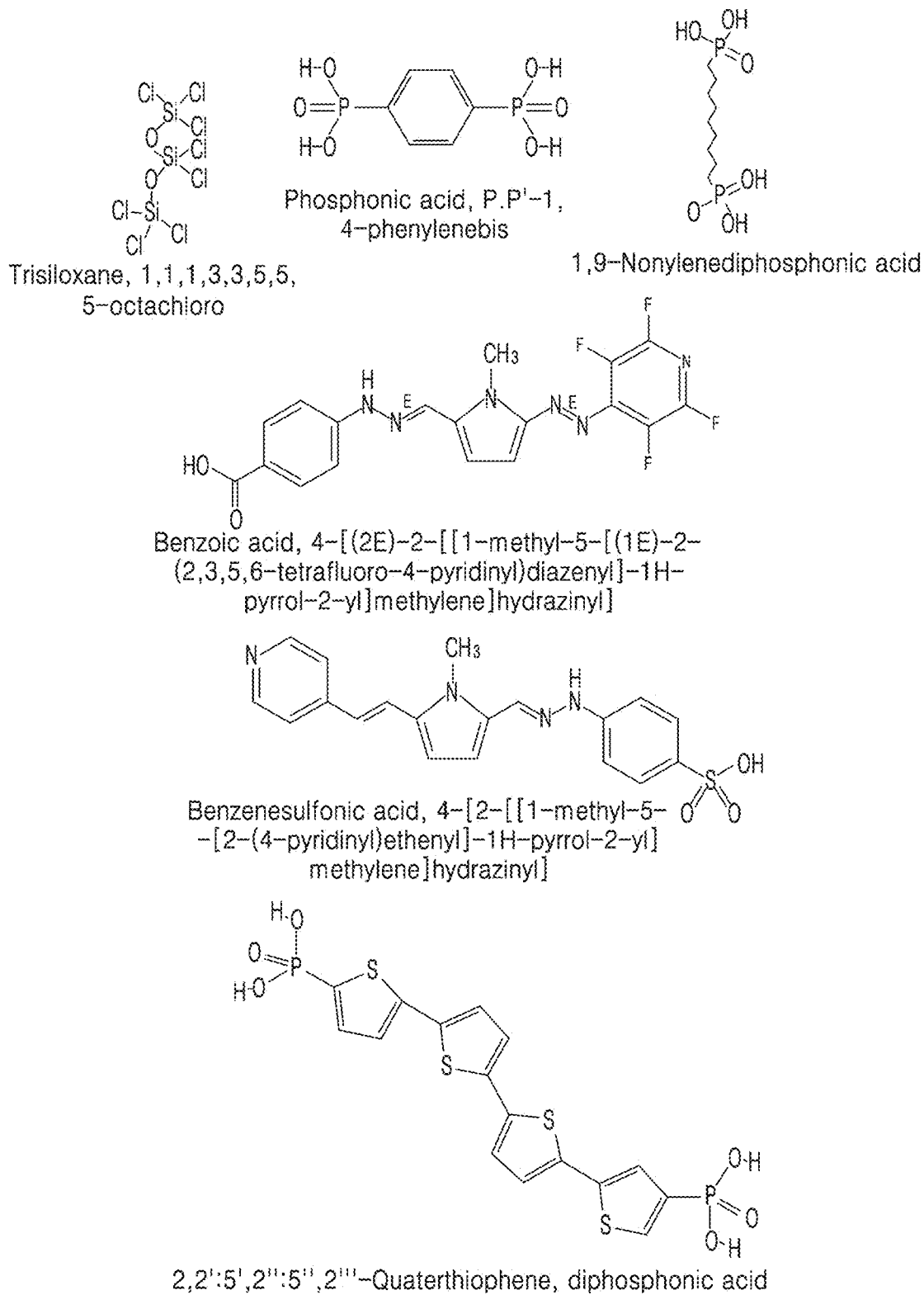
Figure 5E:
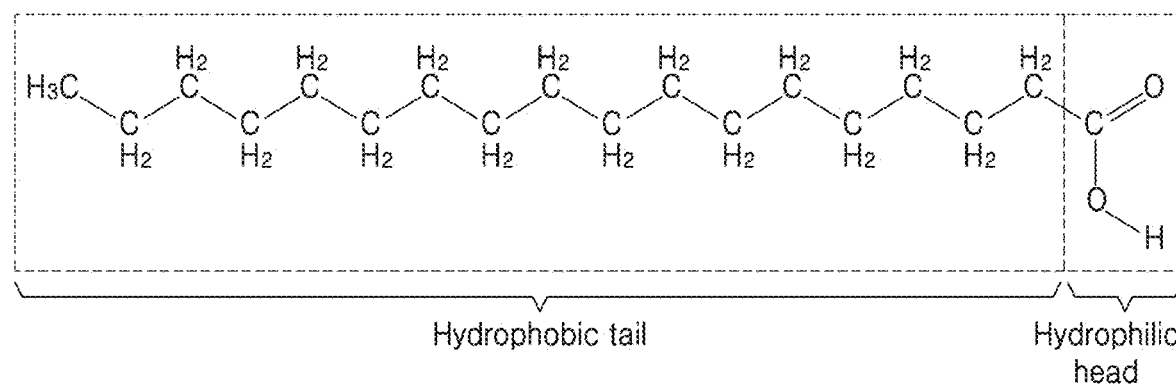
FIG. 5E illustrates a molecular structure of a stearic acid, which is an example of a fatty acid.

Regarding FIG. 5A illustrates embodiments of the SAM when the reactive group is silane, FIG. 5B illustrates embodiments of the SAM when the reactive group is a carboxylic acid, FIG. 5C illustrates embodiments of the SAM when the reactive group is a phosphonic acid, and FIG. 5D illustrates embodiments of the SAM when the reactive group is a precursor having various structures.

In the case of the embodiments of the SAM of FIG. 5A, the reactive groups are commonly silane, but functional groups and alkane chain lengths are different from each other.

Therefore, the embodiments of the SAM of FIG. 5A may include octyltrichlorosilane (OTS), octadecyltrichlorosilane (OTDS), 3-mercaptopropyltrimethoxysilane (MPTMS), hexamethyldisilizane (HMDS), and the like.

Like the embodiments illustrated in FIG. 5A, the embodiments illustrated in FIG. 5B, embodiments illustrated in FIG. 5C, and embodiments illustrated in FIG. 5D are of the SAM, having different functional groups or alkyl chain lengths.

When the stress-reducing layer 400a of an organic luminescence display device according to the present embodiment includes the SAM, transferring of stress to the thin-film encapsulation layer 300 disposed thereunder and cracking of the thin-film encapsulation layer 300 may be prevented.

This is because the SAM includes a reactive group, an alkyl chain, and a functional group, and accordingly, even when stress occurs above the SAM, due to the cushioning of a long alkane chain being the body part, the long alkyl chain absorbs the stress, thereby preventing the transferring of stress toward under the SAM.

The shape change of the stress-reducing layer 400a including the SAM occurring in the manufacturing course of an organic luminescence display device will be described in detail when a method of manufacturing the organic luminescence display device is explained.

In one embodiment, the stress-reducing layer 400b of the organic luminescence display device may include a fatty acid.

FIG. 4B illustrates a view of the stress-reducing layer 400b that includes a fatty acid according to the present embodiment, and the fatty acid is represented as a circle. However, the fatty acid also has a chain shape, and the embodiment of FIG. 4B is presented herein to explain another embodiment of a stress-reducing layer which is different from the stress-reducing layer 400a being the SAM, and the shape of the fatty acid is not limited thereto.

A fatty acid refers to a chain-shape saturated or unsaturated mono carboxylic acid. When fat is hydrolyzed, the fat is decomposed into glycerol and a fatty acid. Fatty acids are classified as a saturated fatty acid and an unsaturated fatty acid according to a carbon bond. When a fatty acid has a double bond in its chain, the fatty acid is classified as an unsaturated fatty acid, and when a fatty acid does not have the double bond in its chain, the fatty acid is classified as a saturated fatty acid.

In one embodiment, the stress-reducing layer 400b may include a stearic acid illustrated in FIG. 5E.

As illustrated in FIG. 5E, the stearic acid has a structure that has a long non-polar hydrocarbon chain having a terminal polar carboxylic group attached thereto, and the hydrocarbon chain is 17 carbon atoms long. The stearic acid is an example of the saturated fatty acid.

The stearic acid has a boiling point of 656K (383° C.) and a melting point of 342K to 344.5K (71.5° C.).

Accordingly, in the case in which the stress-reducing layer 400b includes a stearic acid and is solid, when the stress-reducing layer 400b is exposed to a temperature close to the melting point of the stearic acid, that is, 71.5° C., the stearic acid begins to change into a liquid state, thereby providing flexibility.

When the solid stress-reducing layer 400b is heated at a temperature equal to or higher than 71.5° C., phase change may occur and accordingly, the stearic acid may change into a liquid phase.

As a result, in the case of the stress-reducing layer 400b including a stearic acid, even when stress occurs above the stress-reducing layer 400b, due to the flexibility or liquefaction of the stearic acid forming the stress-reducing layer 400b, transferring stress to the underlying structure of the stress-reducing layer 400b and cracking of the underlying structure may be prevented.

The phase change of the stress-reducing layer 400a including a stearic acid occurring in the manufacturing course of an organic luminescence display device will be described in detail when a method of manufacturing the organic luminescence display device is explained.

Hereinafter, a method of manufacturing an organic luminescence display device, according to the disclosure, will be described in detail.

FIGS. 6A to 6E illustrate cross-sectional views of an organic luminescence display device 2000 to explain a method of manufacturing the organic luminescence display device 2000, according to an exemplary embodiment. Referring to FIGS. 6A to 6E, reference numerals that are identical to those used in connection with FIGS. 1 to 5 denote like elements explained in connection with FIGS. 1 to 5, and description of such elements will be omitted herein.

The method of manufacturing the organic luminescence display device 2000, according to the present embodiment, includes preparing a carrier substrate 10, forming the display unit 200 on the carrier substrate 10, forming the thin-film encapsulation layer 300 sealing the display unit 200, forming the stress-reducing layer 400a on the thin-film encapsulation layer 300, and forming a top protection film 500 on the stress-reducing layer 400a.

The carrier substrate 10 may act as a base carrier on which the display unit 200 is initially formed before components including the display unit 200 and the thin-film encapsulation layer 300 are transferred onto the substrate 100, which may be a thin glass film or may include a plastic material, such as PET or PI, to improve flexibility of the organic luminescence display device 2000. The carrier substrate 10 may include a rigid material, such as glass.

In detail, in manufacturing the organic luminescence display device 2000 with enhanced flexibility, instead of forming components including the display unit 200 directly on the substrate 100 which may be a thin glass film or may include a plastic material, the components may be formed on the carrier substrate 10 that is formed by using a rigid material, such as glass, and then, transferred all at once.

The method of manufacturing the organic luminescence display device 2000, according to the present embodiment, may further include, prior to the preparing the carrier substrate 10 and the forming the display unit 200 on the carrier substrate 10, forming a sacrificial layer 30.

The sacrificial layer 30 may be formed between the carrier substrate 10 and the display unit 200 to protect the display unit 200 from being damaged during when the carrier substrate 10 is separated from components including the display unit 200 and the thin-film encapsulation layer 300 on the carrier substrate 10.

In one embodiment, the sacrificial layer 30 may include an inorganic material. In one embodiment, the sacrificial layer 30 may have a thickness of about 500 Å to about 2000 Å.

In one embodiment, the sacrificial layer 30 may include molybdenum oxide. When the sacrificial layer 30 includes molybdenum oxide, the sacrificial layer 30 may be formed as follows.

First, molybdenum (Mo) metal is deposited on the carrier substrate 10, and then, annealed for about one hour at a temperature of 450° C. When heated, molybdenum (Mo) metal may be oxidized and deposited as molybdenum oxide. A $SiO_2$ film is formed on the molybdenum oxide through a low-temperature CVD process to form the sacrificial layer 30.

Once the sacrificial layer 30 is formed on the carrier substrate 10, the display unit 200 may be formed thereon.

Figure 6A:
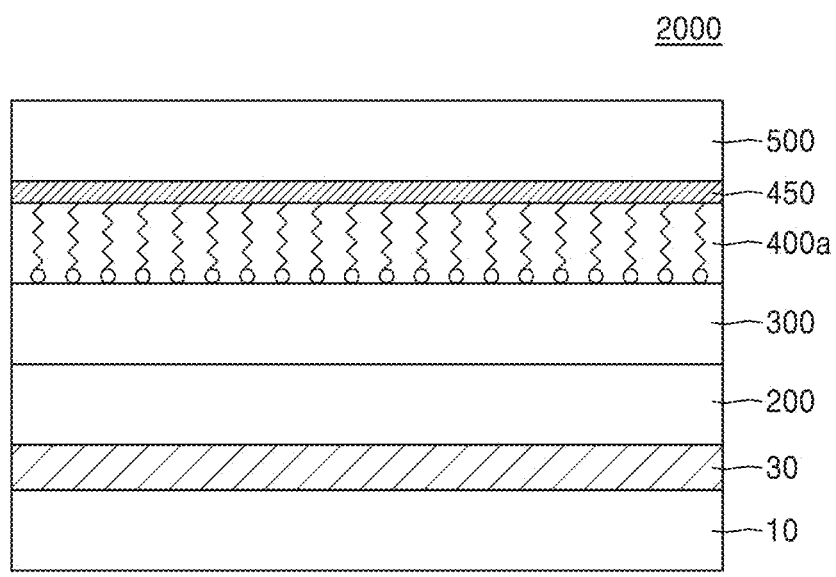
FIGS. 6A to 6E illustrate cross-sectional views of an organic luminescence display device to explain a method of manufacturing the organic luminescence display device according to an exemplary embodiment.

In detail, in one embodiment, the display unit 200 may be formed on the carrier substrate 10 either without an intervening layer therebetween or, as illustrated in FIG. 6A, with the sacrificial layer 30 between the carrier substrate 10 and the display unit 200.

As described above, the display unit 200 may include the thin film transistor TFT and the organic light-emitting device OLED.

After the display unit 200 is formed, the thin-film encapsulation layer 300 sealing the display unit 200 may be formed. In the organic luminescence display device 2000 according to the present embodiment illustrated in FIGS. 6A to 6E, the thin-film encapsulation layer 300 is located on the display unit 200.

The thin-film encapsulation layer 300 is used to completely seal the display unit 200 from external oxygen or moisture, and like in the organic luminescence display device (see 1000 of FIG. 1), the thin-film encapsulation layer 300 may cover the display unit 200 in such a manner that ends of the thin-film encapsulation layer 300 are attached to the substrate 100, thereby enabling a complete sealing of the display unit 200.

The stress-reducing layer 400a may be formed on the thin-film encapsulation layer 300, and in the case of the organic luminescence display device 2000 according to the present embodiment, the stress-reducing layer 400a may include the SAM.

The top protection film 500 may be formed on the stress-reducing layer 400a, and the top protection film 500 may be attached on the stress-reducing layer 400a with an adhesive layer 450.

The top protection film 500 may be the uppermost layer to protect the organic luminescence display device 2000 from being damaged by external moisture or oxygen or external impact in the manufacturing course of the organic luminescence display device 2000. In detail, the top protection film 500 is a temporal component that is used to protect the organic luminescence display device 2000 in the manufacturing course of the organic luminescence display device 2000, and the top protection film 500 does not remain in a final organic luminescence display device.

In one embodiment, the top protection film 500 may include a plastic material, such as PET, but a material for forming the top protection film 500 is not limited thereto.

Figure 6B:
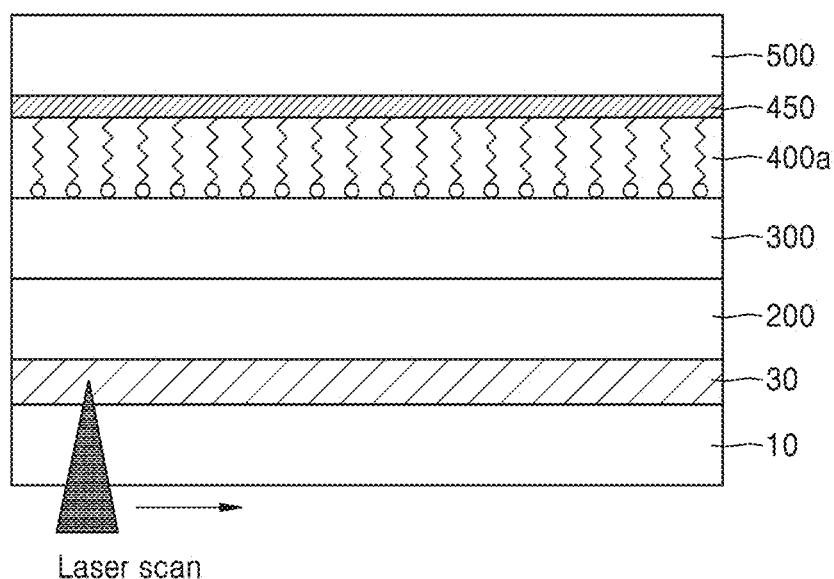

Referring to FIG. 6B, once the display unit 200, the thin-film encapsulation layer 300, the stress-reducing layer 400a, and the top protection film 500 are sequentially formed on the carrier substrate 10, the carrier substrate 10 may be removed from the resultant structure.

The carrier substrate 10 may be separated from the display unit 200 by using a laser lift-off process using a laser, as illustrated in FIG. 6B.

In other words, a laser is irradiated to the sacrificial layer 30 formed on the carrier substrate 10 to separate the carrier substrate 10 and the sacrificial layer 30 from the display unit 200.

In this regard, due to the formation of the sacrificial layer 30, when the carrier substrate 10 is separated from the display unit 200, the display unit 200 may be protected from being thermally damaged or cracking.

In the laser lift-off process, due to the irradiation of a laser, heat is generated and transferred to the display unit 200, the thin-film encapsulation layer 300, the stress-reducing layer 400a, the adhesive layer 450, and the top protection film 500, which are disposed above the carrier substrate 10.

Figure 6C:
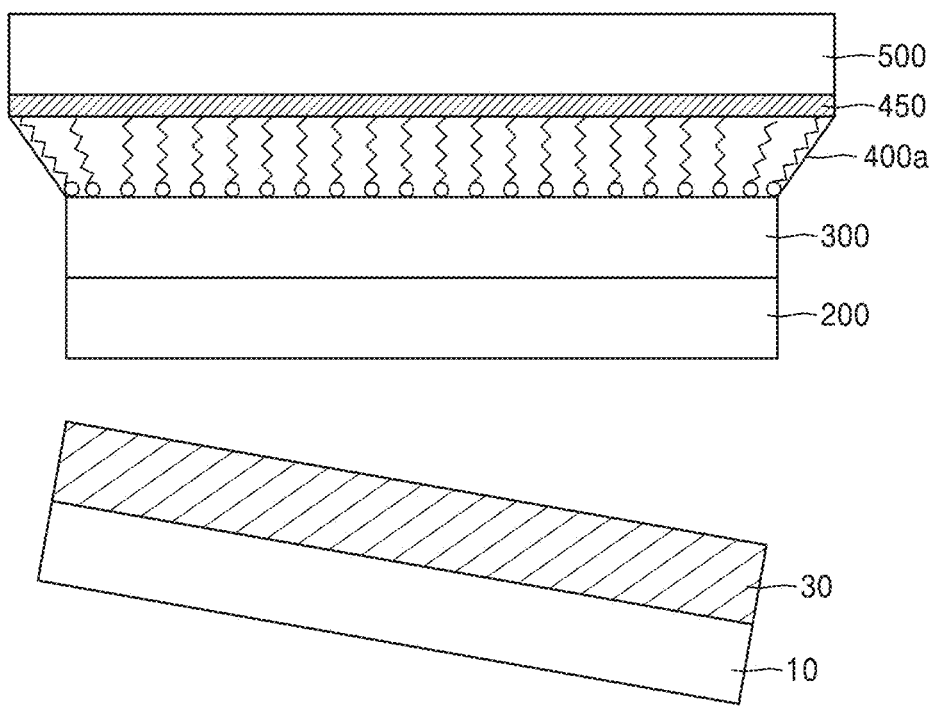

Referring to FIG. 6C, due to the transferred heat, the adhesive layer 450 expands, and also, the top protection film 500 including a plastic material attached on the adhesive layer 450 expands.

In this regard, when the adhesive layer 450 and the top protection film 500 are formed directly on the thin-film encapsulation layer 300, the thin-film encapsulation layer 300 may receive the stress caused by the expansion of the adhesive layer 450 and the top protection film 500 and interface-cracking may occur, thereby affecting the thin-film encapsulation layer 300 and the display unit 200 and damaging the organic light-emitting device OLED.

However, in the case of the organic luminescence display device 2000 according to the present embodiment, the stress-reducing layer 400a including the SAM is formed between the thin-film encapsulation layer 300 and the top protection film 500, and accordingly, the stress-reducing layer 400a absorbs stress and cracking may be prevented.

When the adhesive layer 450 and the top protection film 500 disposed thereabove expand, the stress-reducing layer 400a including the SAM may change in shape due to the liquidity of the long alkyl chain being the body part. The SAM includes the long alkyl chain being the body part, a functional group bonded to the alkyl chain, and a reactive group. Due to such a structure, the SAM may change in shape while retaining liquidity.

That is, as illustrated in FIG. 6C, a top portion of the stress-reducing layer 400a attached on the adhesive layer 450 and the top protection film 500 expands together with the adhesive layer 450 and the top protection film 500, absorbing stress.

Accordingly, stress-induced cracking and transferring of the cracking to components located at a lower level than where the cracking occurs may be prevented.

Figure 6D:
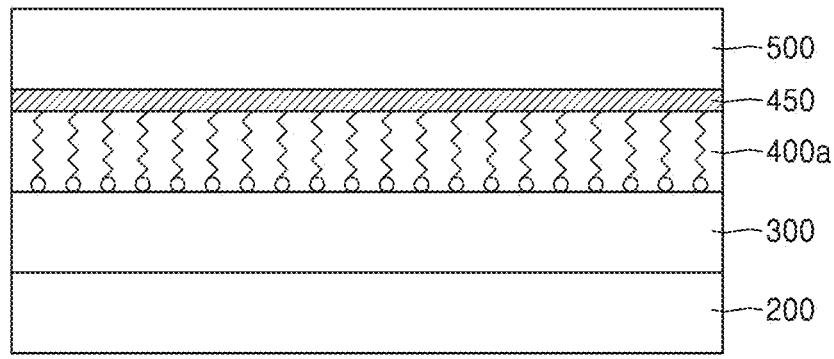

Referring to FIG. 6D, after the carrier substrate 10 and the sacrificial layer 30 are separated and removed from the display unit 200, the adhesive layer 450 and the top protection film 500 may be cooled and thus shrunken, and due to the shrinking the adhesive layer 450 and the top protection film 500, the underlying stress-reducing layer 400a may change in shape correspondingly, thereby shrinking.

As described above, when the method of manufacturing the organic luminescence display device 2000 according to the present embodiment is used, stress is absorbed by the stress-reducing layer 400a when the laser lift-off process is performed, and the carrier substrate 10 may be separated from the display unit 200 without cracking.

Figure 6E:
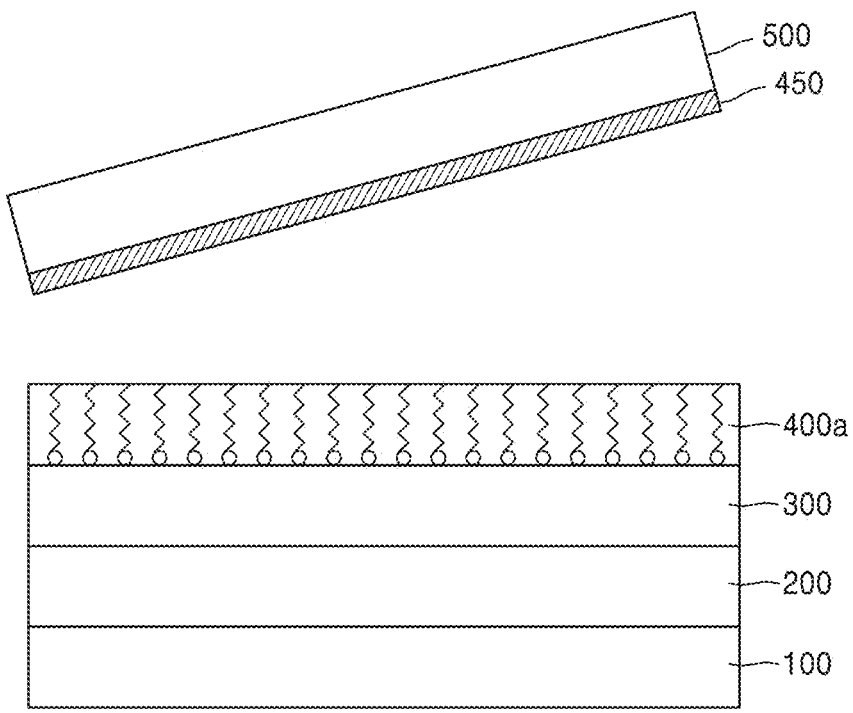

Referring to FIG. 6E, after the removal of the carrier substrate 10, the substrate 100 may be attached on the display unit 200 and the top protection film 500 may be removed. A barrier layer which blocks diffusion of impurity ions, permeation of external gas, and planarizes the surface of the substrate 100, and/or a buffer layer (see 110 of FIG. 2) acting as a blocking layer may be formed on the substrate 100.

After the display unit 200 is attached on the substrate 100, the top protection film 500 is removed together with the adhesive layer 450.

FIGS. 7A to 7E illustrate cross-sectional views of an organic luminescence display device 3000 to explain a method of manufacturing the organic luminescence display device 3000 according to an exemplary embodiment. Referring to FIGS. 7A to 7E, reference numerals that are identical to those used in connection with FIGS. 6A to 6E denote like elements explained in connection with FIGS. 6A to 6E, and description of such elements will be omitted herein.

The method of manufacturing the organic luminescence display device 3000 according to the present embodiment includes preparing a carrier substrate 10, forming the display unit 200 on the carrier substrate 10, forming the thin-film encapsulation layer 300 sealing the display unit 200, forming the stress-reducing layer 400b on the thin-film encapsulation layer 300, and forming a top protection film 500 on the stress-reducing layer 400b.

In the organic luminescence display device 3000 according to the present embodiment illustrated in FIGS. 7A to 7E, the thin-film encapsulation layer 300 is disposed on the display unit 200. However, as in the embodiment explained in connection with FIG. 6A to FIG. 6E, like the organic luminescence display device (see 1000 of FIG. 1) of FIG. 1, the thin-film encapsulation layer 300 covers the display unit 200 in such a manner that ends of the thin-film encapsulation layer 300 are attached on the substrate 100, thereby enabling a complete sealing of the display unit 200.

Figure 7A:
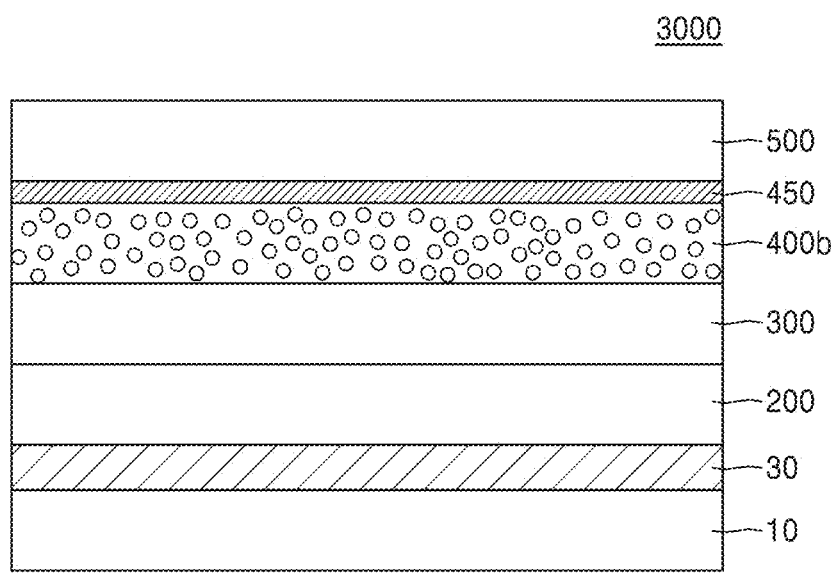
FIGS. 7A to 7E illustrate cross-sectional views of an organic luminescence display device to explain a method of manufacturing an organic luminescence display device according to another exemplary embodiment.

As illustrated in FIG. 7A, the stress-reducing layer 400b may be formed on the thin-film encapsulation layer 300, and in the case of the organic luminescence display device 3000 according to the present embodiment, the stress-reducing layer 400b may include a fatty acid.

In one embodiment, the stress-reducing layer 400b may include a stearic acid.

Figure 7B:
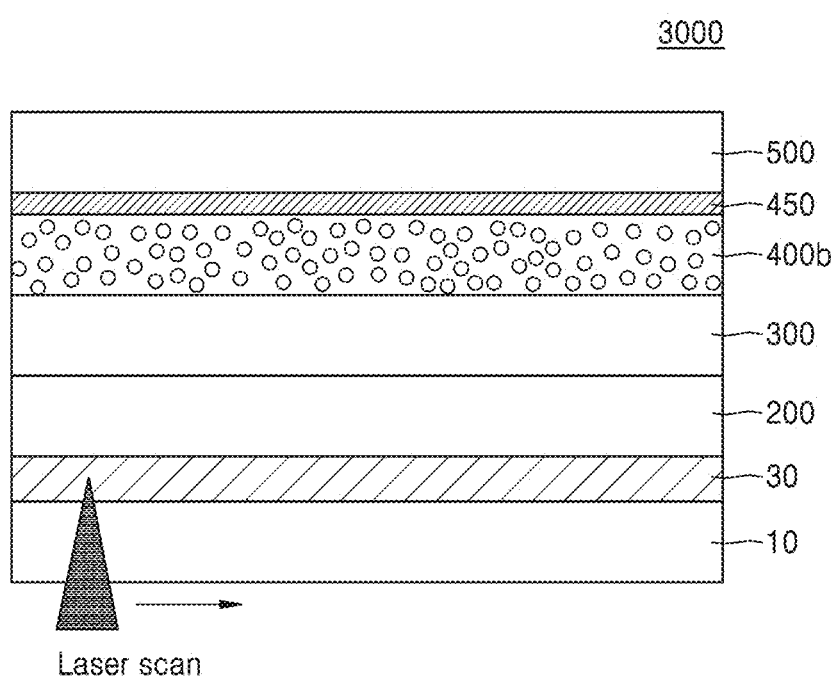

Referring to FIG. 7B, the carrier substrate 10 may be separated from the display unit 200 by using a laser lift-off process using a laser.

In other words, a laser is irradiated to the sacrificial layer 30 formed on the carrier substrate 10 to separate the carrier substrate 10 and the sacrificial layer 30 from the display unit 200.

In the laser lift-off process, due to the irradiation of a laser, heat is generated and transferred to the display unit 200, the thin-film encapsulation layer 300, the stress-reducing layer 400b, the adhesive layer 450, and the top protection film 500, which are disposed above the carrier substrate 10.

Figure 7C:
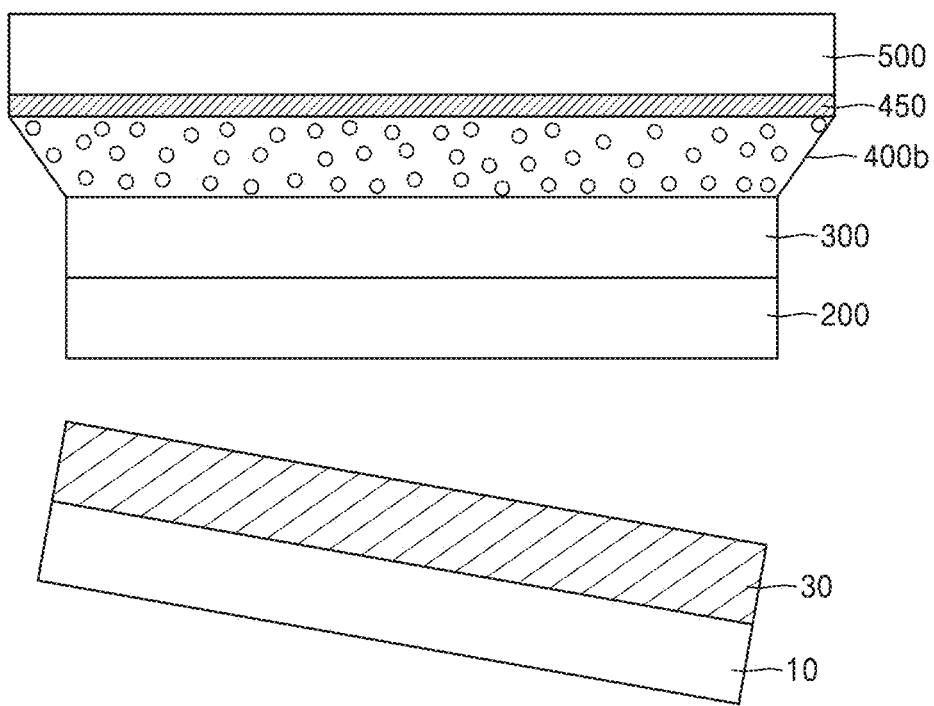

Referring to FIG. 7C, due to the transferred heat, the adhesive layer 450 expands, and also, the top protection film 500 including a plastic material attached on the adhesive layer 450 expands.

In this regard, when the adhesive layer 450 and the top protection film 500 are formed directly on the thin-film encapsulation layer 300, the thin-film encapsulation layer 300 may receive the stress caused by the expansion of the adhesive layer 450 and the top protection film 500 and interface-cracking may occur, thereby affecting the thin-film encapsulation layer 300 and the display unit 200 and damaging the organic light-emitting device OLED.

However, in the case of the organic luminescence display device 3000 according to the present embodiment, the stress-reducing layer 400b including the stearic acid is formed between the thin-film encapsulation layer 300 and the top protection film 500, and accordingly, the stress-reducing layer 400b absorbs stress and cracking may be prevented.

As described above, the stearic acid constituting the stress-reducing layer 400b has a boiling point of 656K (38° C.) and a melting point of 342 to 344.5K (71.5° C.)

Accordingly, when heat having a temperature equal to or higher than the melting point (71.5° C.) of the stearic acid is transferred to the stress-reducing layer 400b, the stress-reducing layer 400b changes in phase from a solid state to a liquid state, and when the stress-reducing layer 400b in the liquid state is cooled to a temperature lower than the melting point (71.5° C.), the stress-reducing layer 400b may return to its solid state.

In other words, referring to FIG. 7C, due to the transferred heat, the adhesive layer 450 and the top protection film 500 may expand, and the stress-reducing layer 400b including the stearic acid may be liquefied or may become flexible so that the stress-reducing layer 400b may expand together with the adhesive layer 450 and the top protection film 500.

Figure 7D:
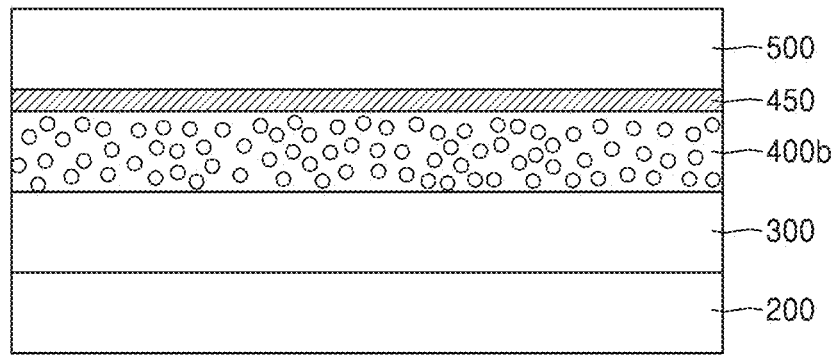

When the carrier substrate 10 is removed by using a laser lift-off process and then the temperature is decreased, as illustrated in FIG. 7D, the adhesive layer 450 and the top protection film 500 shrink and due to the decrease in the temperature to the melting point (71.5° C.) or lower, the liquid stearic acid is solidified and the stress-reducing layer 400b may shrink.

As described above, when the method of manufacturing the organic luminescence display device 3000 according to the present embodiment is used, stress is absorbed by the stress-reducing layer 400b when the laser lift-off process is performed, and the carrier substrate 10 may be separated from the display unit 200 without cracking.

Figure 7E:
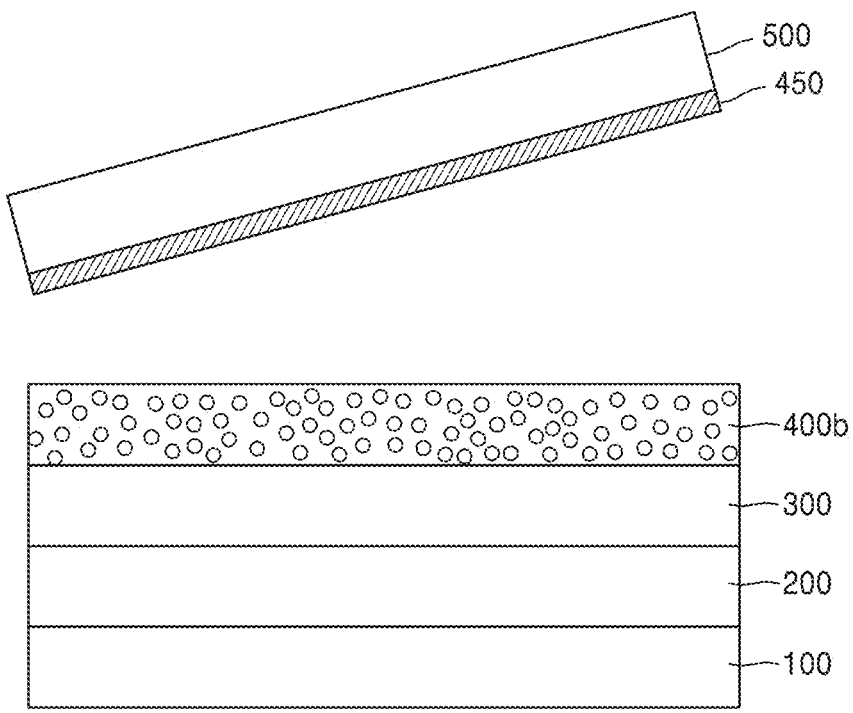

Referring to FIG. 7E, after the removal of the carrier substrate 10, the substrate 100 may be attached on the display unit 200 and the top protection film 500 may be removed. A barrier layer which blocks diffusion of impurity ions, permeation of external gas, and planarizes the surface of the substrate 100, and/or a buffer layer (see 110 of FIG. 2) acting as a blocking layer may be formed on the substrate 100.

After the display unit 200 is attached on the substrate 100, the top protection film 500 is removed together with the adhesive layer 450.

According to the above-described embodiments, cracking occurring when a carrier substrate is separated from a display unit may be prevented.

Other effects of the disclosure may also be inducible in view of the description provided above in connection with the drawings.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. A method of manufacturing an organic luminescence display device, the method comprising:
preparing a carrier substrate;
forming a sacrificial layer on the carrier substrate;
forming a display unit on the sacrificial layer;
forming a thin-film encapsulation layer sealing the display unit;
forming a stress-reducing layer on the thin-film encapsulation layer;
forming a top protection film on the stress-reducing layer; and
removing the carrier substrate, after the forming of the top protection film, by irradiating the sacrificial layer with a laser to separate the carrier substrate from the display unit,
wherein the stress-reducing layer comprises an organic molecular film,
wherein the stress-reducing layer comprises a fatty acid,
wherein when the sacrificial layer is irradiated by the laser, the stress reducing layer expands, and
wherein the stress reducing layer shrinks after the carrier substrate is removed.

2. The method of claim 1, wherein the fatty acid comprises a stearic acid having a carbon chain.

3. The method of claim 1, wherein when the sacrificial layer is irradiated by the laser, and after the carrier substrate is removed, the stress-reducing layer changes in phase.

4. The method of claim 3, wherein when the sacrificial layer is irradiated by the laser, the stress-reducing layer is liquefied, and after the carrier substrate is removed, the stress-reducing layer is solidified.

5. The method of claim 1, wherein the stress-reducing layer has a thickness within a range of 1 nm to 3 nm.

6. The method of claim 1, wherein the stress-reducing layer is configured to absorb stress from the thin-film encapsulation layer and prevent the thin-film encapsulation layer from cracking.

7. The method of claim 6, wherein the stress-reducing layer is configured to absorb the stress from the thin-film encapsulation layer by changing from a solid phase to a liquid phase.

* * * * *